US011170976B2

(12) United States Patent
Matsumoto

(10) Patent No.: US 11,170,976 B2
(45) Date of Patent: Nov. 9, 2021

(54) MULTI-BEAM WRITING METHOD AND MULTI-BEAM WRITING APPARATUS

(71) Applicant: NuFlare Technology, Inc., Yokohama (JP)

(72) Inventor: Hiroshi Matsumoto, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 16/929,300

(22) Filed: Jul. 15, 2020

(65) Prior Publication Data

US 2021/0027986 A1    Jan. 28, 2021

(30) Foreign Application Priority Data

Jul. 25, 2019   (JP) .............................. JP2019-137072

(51) Int. Cl.
*H01J 37/317* (2006.01)
*H01J 37/304* (2006.01)
*H01J 37/302* (2006.01)

(52) U.S. Cl.
CPC ...... *H01J 37/3177* (2013.01); *H01J 37/3026* (2013.01); *H01J 37/3045* (2013.01); *H01J 2237/30461* (2013.01)

(58) Field of Classification Search
CPC .............. H01J 37/3177; H01J 37/3026; H01J 37/3045; H01J 37/302; H01J 37/3023; H01J 2237/30461; H01J 2237/30455; H01J 2237/3045; H01J 2237/30433
See application file for complete search history.

(56) References Cited

U.S. PATENT DOCUMENTS

| RE47,561 E | 8/2019 | Yoshikawa et al. |
| 2003/0189181 A1 | 10/2003 | Ohta et al. |
| 2011/0204224 A1* | 8/2011 | Yamada ............. H01J 37/3177 250/307 |
| 2012/0256106 A1* | 10/2012 | Kurokawa ................ G03F 1/78 250/492.22 |

(Continued)

FOREIGN PATENT DOCUMENTS

| JP | 2003-297732 A | 10/2003 |
| JP | 2013-55144 A | 3/2013 |

(Continued)

*Primary Examiner* — Sean M Luck
(74) *Attorney, Agent, or Firm* — Oblon, McClelland, Maier & Neustadt, L.L.P.

(57) ABSTRACT

In one embodiment, a multi-beam writing method includes acquiring a plurality of pieces of position deviation data corresponding to a plurality of parameter values of a parameter that change position deviation amount of each beam of multi-beam irradiated on a substrate, calculating a plurality of pieces of reference coefficient data corresponding to each of the plurality of pieces of position deviation data, calculating coefficient data corresponding to a parameter value at an irradiation position of the multi-beam on the substrate using the plurality of pieces of reference coefficient data corresponding to the plurality of parameter values, modulating an irradiation amount of each beam of the multi-beam for each shot using the coefficient data, and writing a pattern by irradiating the substrate with each beam of at least a part of the multi-beam having the modulated irradiation amounts.

10 Claims, 7 Drawing Sheets

(56) References Cited

U.S. PATENT DOCUMENTS

| | | | |
|---|---|---|---|
| 2012/0295202 A1* | 11/2012 | Sano | B82Y 10/00 |
| | | | 430/296 |
| 2013/0320230 A1* | 12/2013 | Yoshikawa | H01J 37/28 |
| | | | 250/398 |
| 2014/0175303 A1 | 6/2014 | Touya et al. | |
| 2015/0064934 A1 | 3/2015 | Yoshikawa et al. | |
| 2015/0131075 A1* | 5/2015 | Kato | H01J 37/3177 |
| | | | 355/77 |
| 2015/0155138 A1* | 6/2015 | Yoshikawa | H01J 37/243 |
| | | | 250/492.22 |
| 2015/0206709 A1 | 7/2015 | Nakayamada | |
| 2016/0015561 A1 | 6/2016 | Kawana et al. | |
| 2016/0181062 A1 | 6/2016 | Kato et al. | |
| 2016/0314933 A1* | 10/2016 | Kato | H01J 37/3026 |
| 2017/0352520 A1* | 12/2017 | Matsumoto | H01J 37/1471 |
| 2018/0114673 A1* | 4/2018 | Matsumoto | H01J 37/3026 |
| 2018/0233324 A1* | 8/2018 | Anze | G03F 7/20 |
| 2019/0043693 A1 | 2/2019 | Matsumoto | |
| 2019/0214226 A1* | 7/2019 | Platzgummer | H01J 37/3177 |
| 2019/0237297 A1* | 8/2019 | Nishimura | H01J 37/20 |

FOREIGN PATENT DOCUMENTS

| | | |
|---|---|---|
| JP | 2014-7379 A | 1/2014 |
| JP | 2014-127568 A | 7/2014 |
| JP | 2015-138882 A | 7/2015 |
| JP | 2016-103557 A | 6/2016 |
| JP | 2016-119423 A | 6/2016 |
| JP | 2019-33117 A | 2/2019 |

\* cited by examiner

MULTI-BEAM WRITING METHOD AND MULTI-BEAM WRITING APPARATUS

CROSS REFERENCE TO RELATED APPLICATION

This application is based upon and claims benefit of priority from the Japanese Patent Application No. 2019-137072, filed on Jul. 25, 2019, the entire contents of which are incorporated herein by reference.

FIELD

The present invention relates to a multi-beam writing method and a multi-beam writing apparatus.

BACKGROUND

As LSI circuits are increasing in density, the line width of circuits of semiconductor devices is becoming finer. To form a desired circuit pattern onto a semiconductor device, a method of reducing and transferring, by using a reduction-projection exposure apparatus, onto a wafer a highly precise original image pattern (mask, or reticle, in particular, when used in a stepper or a scanner) formed on a quartz is employed. The highly precise original image pattern is written by using an electron beam writing apparatus, in which a technology commonly known as electron beam lithography is used.

Compared with a case where writing is performed using single electron beam, a writing apparatus using multi-beam can perform irradiation with many beams at once, and thus the throughput can be greatly improved. In a multi-beam writing apparatus using a blanking aperture array, which is an embodiment of a multi-beam writing apparatus, for example, an electron beam emitted from one electron gun is caused to pass through a shaping aperture array having a plurality of openings to form multi-beam (a plurality of electron beams). The multi-beam passes through respective corresponding blankers, which will be described later, of the blanking aperture array. The blanking aperture array has pairs of electrodes that individually deflect the beams, and an opening for allowing a beam to pass therethrough is formed between each pair of electrodes. Blanking deflection is performed on an electron beam passing through the opening by fixing one of the pair of electrodes (a blanker) to a ground potential and switching the other electrode between the ground potential and a potential other than the ground potential. The electron beam deflected by the blanker is blocked and an electron beam that is not deflected is radiated onto a substrate.

The multi-beam writing apparatus divides a writing region of the substrate into a plurality of mesh-like pixels, and writes a desired pattern by combining pixel patterns (bit patterns) formed by irradiating each pixel with a beam having a necessary irradiation amount. The irradiation amount of each pixel is calculated from the pixel-based area density of a writing pattern defined in writing data.

In multi-beam writing, a systematic deviation occurs in a multi-beam array plane at an irradiation position of each beam among the multi-beam on a test sample surface due to, for example, characteristics of the optical system. In a case where the number of beams is significantly large in the multi-beam writing apparatus, it is difficult to provide an independent deflection mechanism for each of the multi-beam and to correct a position deviation of each of the multi-beam individually. Instead, irradiation amount modulation processing is performed in accordance with a position deviation amount of each beam among the multi-beam, so that the effect of beam position deviations can be made not to appear in a dose distribution given to a resist even in a case where exposure is performed with beams that have been deviated in position. That is, by calculating a correction irradiation amount on each beam from position deviation amounts of individual beams and by performing exposure using the correction irradiation amounts with position deviations, the effect of the beam position deviations can be prevented from appearing in the dose distribution given to a resist by the multi-beam. As this processing, there is a method in which a dose defined for each of pixels arranged at equal pitches is allocated to beams around the pixel in accordance with weights calculated from position deviation amounts of the beams.

In such irradiation amount modulation processing, by referring to coefficient data (a set of coefficients) indicating weights by which an irradiation amount of one of the pixels arranged regularly on a sample is distributed to a plurality of beams having position deviations and arranged around the pixel, a correction irradiation amount of each beam is calculated by multiplying a coefficient and an irradiation amount of each pixel together.

For example, before writing processing is executed, by measuring in advance the position of a pattern obtained by irradiating an evaluation substrate with the multi-beam, the position deviation amounts of plurality of beams of the multi beam or groups of beams of multi beam are measured, and a position deviation map is generated. The position deviation amount of each beam among the multi-beam is then calculated on the basis of the generated position deviation map to calculate coefficient data for calculating a correction irradiation amount of each beam. Coefficient data calculation processing requires high computational complexity, and thus coefficient data is calculated in advance before writing processing. Based on the premise that the position deviation map does not change during writing processing, the correction irradiation amount of each beam is calculated using the coefficient data calculated in advance.

However, a problem could occur in that the position deviation map changes due to, for example, focal point correction and a deviation of a beam axis during writing and the writing accuracy decreases.

DETAILED DESCRIPTION

In one embodiment, a multi-beam writing method includes acquiring a plurality of pieces of position deviation data corresponding to a plurality of parameter values of a parameter that change position deviation amount of each beam of multi-beam irradiated on a substrate, calculating a plurality of pieces of reference coefficient data corresponding to each of the plurality of pieces of position deviation data, calculating coefficient data corresponding to a parameter value at an irradiation position of the multi-beam on the substrate using the plurality of pieces of reference coefficient data corresponding to the plurality of parameter values, modulating an irradiation amount of each beam of the multi-beam for each shot using the coefficient data, and writing a pattern by irradiating the substrate with each beam of at least a part of the multi-beam having the modulated irradiation amounts.

An embodiment of the present invention will be described below with reference to the drawings. In the embodiment, a configuration using an electron beam as an example of a charged particle beam will be described. The beam is not limited to the electron beam. For example, a beam using other charged particles such as an ion beam or a beam using laser may be used.

Figure 1:
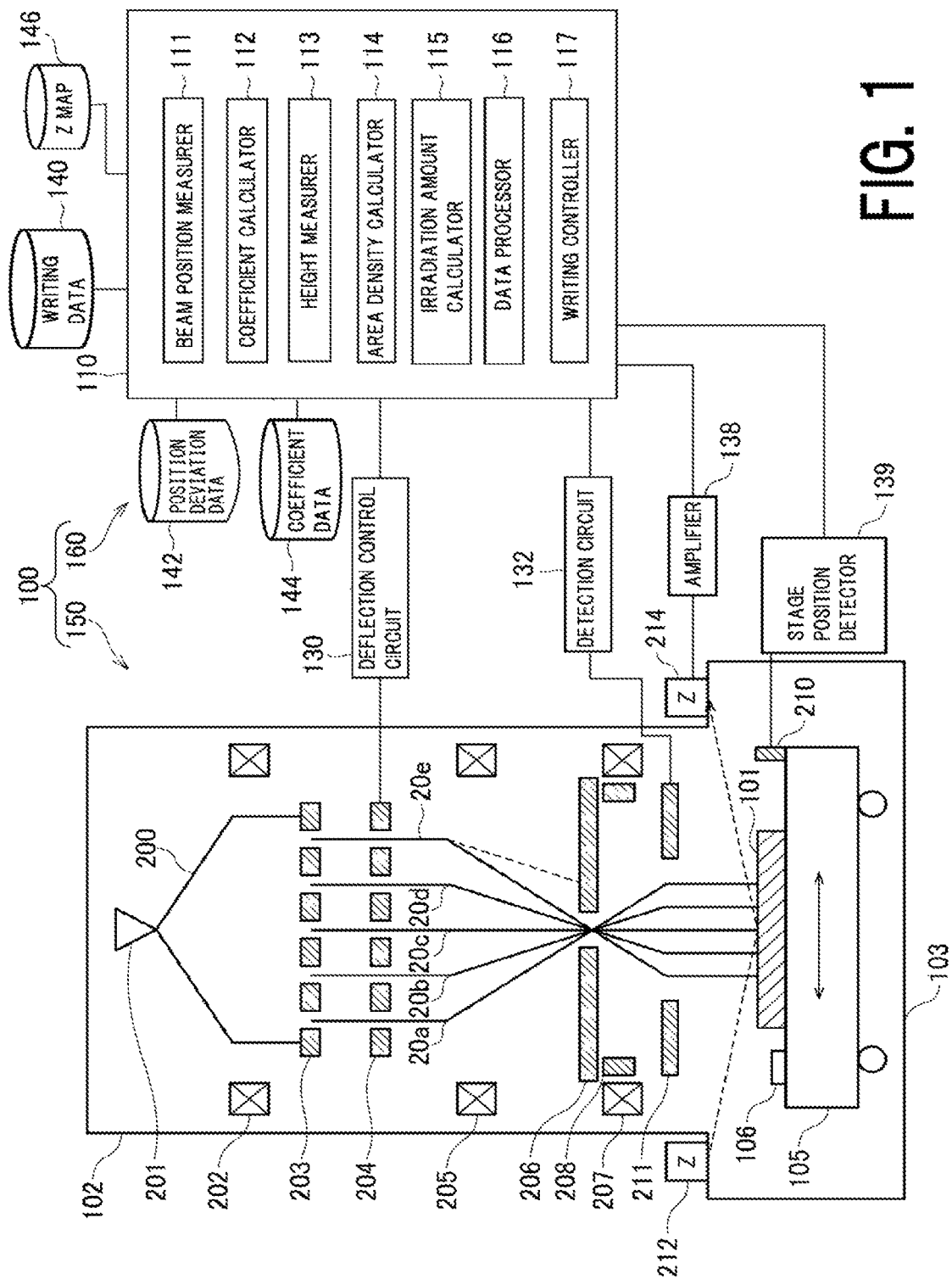
FIG. 1 is a schematic configuration diagram of a writing apparatus according to an embodiment of the present invention.

FIG. 1 is a schematic configuration diagram of a writing apparatus according to an embodiment. As illustrated in FIG. 1, a writing apparatus 100 includes a writing unit 150 and a control unit 160. The writing apparatus 100 is an example of a multiple charged particle beam writing apparatus. The writing unit 150 includes an electron column 102 and a writing chamber 103. In the electron column 102, an electron gun 201, an illumination lens 202, a shaping aperture member 203, a blanking plate 204, a reduction lens 205, a limiting aperture member 206, an objective lens 207, a deflector 208, and a detector 211 are arranged.

In the writing chamber 103, an XY stage 105 is arranged. In the writing chamber 103, a phototransmitter 212 and a photodetector 214 of a Z sensor are arranged. On the XY stage 105, a substrate 101, which is a writing target, is arranged. The substrate 101 is, for example, a mask blank or a semiconductor substrate (a silicon wafer). On the XY stage 105, a mark 106 and a mirror 210 for position measurement are arranged.

The control unit 160 includes a control calculator 110, a deflection control circuit 130, a detection circuit 132, an amplifier 138, a stage position detector 139, and memories 140, 142, 144, and 146. Writing data is input from the outside and stored in the memory 140.

The control calculator 110 includes a beam position measurer 111, a coefficient calculator 112, a height measurer 113, an area density calculator 114, an irradiation amount calculator 115, a data processor 116, and a writing controller 117. The individual units of the control calculator 110 may be constituted by hardware devices such as an electric circuit or may be constituted by software products such as a program carrying out these functions. Alternatively, they may also be constituted by a combination of a hardware device and a software product.

The stage position detector 139 performs irradiation with a laser, receives light reflected from the mirror 210, and detects the position of the XY stage 105 on the basis of principles of laser interferometry.

Figure 2:
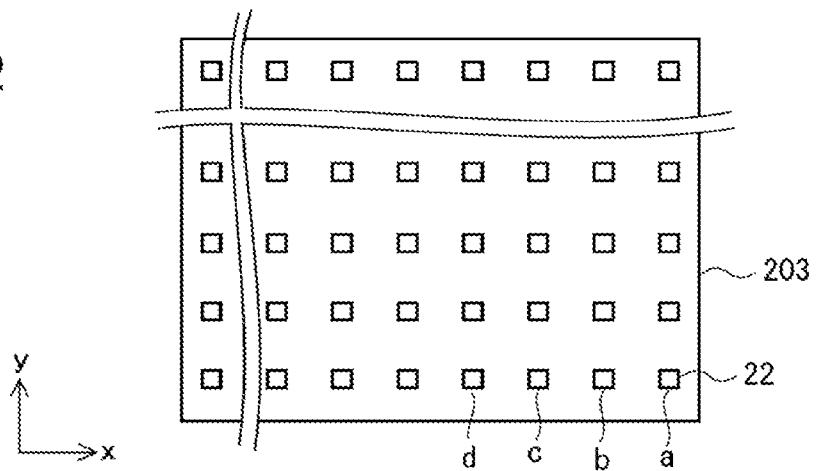
FIG. 2 is a schematic diagram of a shaping aperture member.

FIG. 2 is a schematic diagram illustrating the configuration of the shaping aperture member 203. As illustrated in FIG. 2, in the shaping aperture member 203, openings 22 are formed with predetermined arrangement pitches so as to have m vertical (the y direction) columns×n horizontal (the x direction) columns (m, n≥2). Each opening 22 is rectangularly formed in the same size and shape. Each opening 22 may be a circle having the same outside diameter. Portions of the electron beam 200 pass through the plurality of respective openings 22, and consequently multi-beam 20a to 20e is formed.

In the blanking plate 204, through holes are formed so as to match the arrangement positions of the individual openings 22 of the shaping aperture member 203. A set of two electrodes (blankers) serving as a pair is arranged at each through hole. By grounding one of the electrodes to maintain a ground potential and by switching the other one of the electrodes to the ground potential or a voltage other than the ground potential, on/off of deflection of a beam passing through the through hole is switched, that is, blanking control is performed. In a case where a blanker does not deflect a beam, the beam enters an on state, and the blanker does not change the position of the beam that has entered the on state on a sample surface. That is, the blanker does not perform position control on an individual beam that has entered the on state. In this manner, a plurality of blankers perform blanking deflection on the respective corresponding multi-beam having passed through the plurality of openings 22 of the shaping aperture member 203.

An electron beam 200 emitted from the electron gun 201 (an emission unit) is caused to illuminate the entirety of the shaping aperture member 203 by the illumination lens 202. The electron beam 200 illuminates a region including all the openings 22. The electron beam 200 passes through the plurality of openings 22 of the shaping aperture member 203, and consequently for example a plurality of electron beams (multiple beams) 20a to 20e having a rectangular shape are formed.

The multi-beam 20a to 20e passes through the respective corresponding blankers of the blanking plate 204. Each blanker performs blanking control on the electron beam that has individually passed therethrough. The multi-beam 20a to 20e, which has passed through the blanking plate 204, is reduced by the reduction lens 205, and the resulting beams advance toward the central opening formed in the limiting aperture member 206.

An electron beam deflected by the blanker of the blanking plate 204 is displaced from the position of the central opening of the limiting aperture member 206 and is blocked by the limiting aperture member 206. In contrast, an electron beam that has not been deflected by the blanker of the blanking plate 204 passes through the central opening of the limiting aperture member 206. Blanking control is performed in accordance with on/off of deflection of the blanker, and the beam is controlled to be on/off.

The limiting aperture member 206 blocks individual beams which are deflected by a plurality of blankers to be in the beam off state. Multiple beams for one shot are formed using beams that have passed through the limiting aperture member 206 from when the state is changed to beam on to when the beam on is changed to beam off. Multiple beams that have passed through the limiting aperture member 206 are focused by the objective lens 207, and become a pattern image having a desired reduction ratio. The individual beams having passed through the limiting aperture member 206 (all the multi-beam) are deflected collectively in the same direction by the deflector 208, and a desired position on the substrate 101 is irradiated with the beams. A pattern is written by irradiating the substrate 101 with at least a part of the multi-beam in the beam-on state.

In a case where the XY stage 105 is continuously moved, while at least a test sample is being irradiated with beams, the deflector 208 performs control such that the irradiation position of the beams follows the movement of the XY stage 105. The multi-beam 20 with which irradiation is performed at a time is ideally arranged with pitches obtained by multiplying the arrangement pitch of the plurality of openings of the shaping aperture member 203 by the above-described desired reduction ratio. The writing apparatus 100 performs a writing operation using a raster scan method in which shot beams are continuously radiated in order.

When pixels defined on the sample surface (a surface of the substrate 101) are exposed to the multi-beam, the writing apparatus 100 controls exposure time of each beam of the multi-beam independently such that a predetermined dose is given on each pixel. The beams are controlled to be on by blanking control after the positions of the beams are set on the sample surface through deflection, and the beams are controlled to be off after a predetermined time has passed. In a case where the exposure amount of a pixel is zero, during pixel exposure, the beam is held in the off state. Exposure of a pixel and shifting to the next pixel to be exposed are repeatedly performed using a raster scan method, and deflection control is performed such that the beam stays still with respect to the stage during exposure as described above. In a case where the position of an individual beam is deviated, the beam position is deviated from the pixel position. In this case, by adjusting the exposure amount through modulation of the exposure time of each beam as described above, correction processing to make a dose profile for a sample close to a dose profile obtained when the position of the beam is not deviated can be added.

Figure 3A:
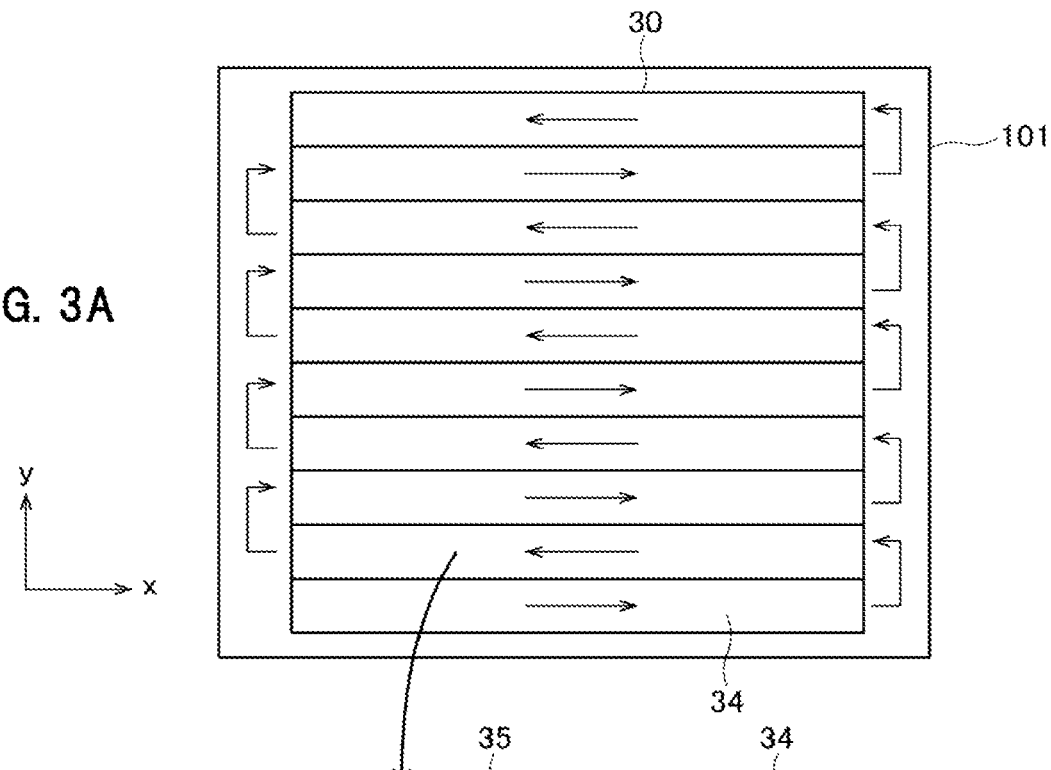
FIGS. 3A to 3C are diagrams for describing a writing operation.

FIG. 3 includes schematic diagrams for describing a writing operation in the embodiment. As illustrated in FIG. 3A, a writing region 30 of the substrate 101 is divided into, for example, a plurality of strip-shaped stripe regions 34 having a predetermined width in the y direction. Each stripe region 34 is a unit writing region. First, adjustment is performed such that an irradiation region 35, which can be irradiated by performing single irradiation with multi-beam, is located at the left end of the first stripe region 34 by moving the XY stage 105, and writing is started.

Figure 3B:
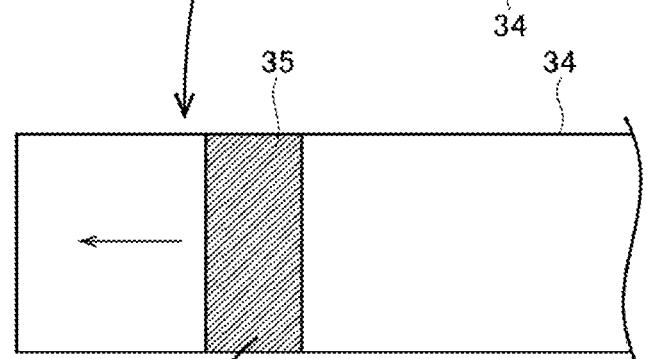

When writing is performed in the first stripe region 34, writing is performed relatively in the +x direction by moving the XY stage 105 in the −x direction. The XY stage 105 is continuously moved at a predetermined speed. After writing is finished in the first stripe region 34, adjustment is performed such that the irradiation region 35 is located at the right end of the second stripe region 34 by moving the stage position in the −y direction. Next, as illustrated in FIG. 3B, writing is performed in the −x direction by moving the XY stage 105 in the +x direction.

Writing is performed in the +x direction in the third stripe region 34, and writing is performed in the −x direction in the fourth stripe region 34. Writing time can be shortened by alternately changing the writing directions. In each stripe region 34, writing may also be performed in the same direction.

Figure 3C:
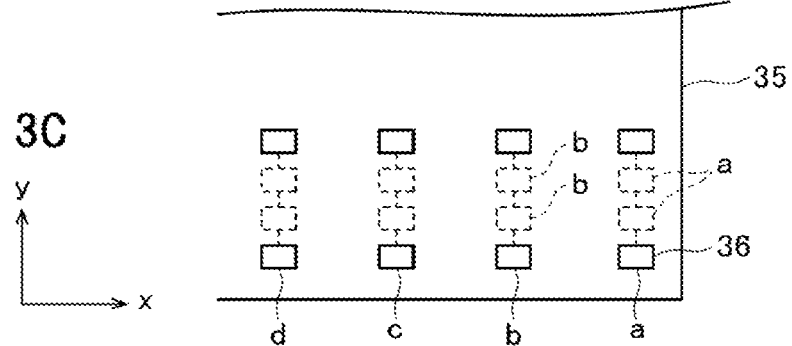

When writing is performed in each stripe region 34, while the XY stage 105 is being moved in the x direction, the writing is performed using a raster scan method in which deflection is performed by the deflector 208 such that, for example, shots are sequentially moved (scanned) in the y direction and irradiation with shot beams is continuously performed in order. For example, the deflector 208 performs deflection such that shots are sequentially moved (scanned) in the y direction while deflection is being performed in the x direction so as to follow the moving speed of the XY stage 105. Consequently, as illustrated in FIG. 3C, irradiation is performed with a shot pattern 36 formed by a beam that has passed through one opening a of the shaping aperture member 203 while the shot pattern is being shifted in order in the y direction from a position irradiated for the first time. Likewise, irradiation is performed with a shot pattern 36 formed by a beam that has passed through one opening b of the shaping aperture member 203 while the shot pattern is being shifted in order in the y direction from a position irradiated for the first time. Likewise, irradiation is performed with shot patterns 36 formed by beams that have passed through the other openings while each shot pattern is being shifted in order in the y direction from a position irradiated for the first time.

When writing processing is performed, ideally, the positions of pixels are irradiated with the respective multi-beam; however, practically, the irradiation position of each beam among the multi-beam in each shot is deviated from the position of a pixel due to various factors. For example, lens aberration causes the position deviation of each beam among the multi-beam dependent on an in-plane position within a beam array. Generally, in a mask writing apparatus, processing for changing a beam focus position during writing, that is, Z position correction is performed in accordance with unevenness in the height of the top surface of the substrate. The unevenness is caused by, for example, a warp in the substrate 101 or bending of the substrate 101 due to gravity. The height of the top surface of the substrate is measured at a plurality of positions of the substrate before writing. At each position, the height of the top surface of the substrate and a focus correction amount are predetermined. In a case where the relationship between the height of the top surface of the substrate and the focus correction amount is not properly set, the beam position deviation including a beam array rotational component occurs. That is, the beam position deviation dependent on the height of the top surface of the substrate or dependent on a position on the substrate occurs. In addition, in a case where lenses used in Z position correction are not properly adjusted, even when the relationship between the height of the top surface of the substrate and the focus correction amount is properly set, the beam position deviation dependent on a position on the substrate occurs.

Thus, in the present embodiment, for each of a plurality of Z position correction amounts, the position deviation amount map at the position of each beam among the multi-beam is predetermined, and irradiation amount modulation processing is performed in accordance with a Z position correction amount at each position on a sample. Consequently, even when the position deviation map of the beam changes due to dependency on the Z position correction amount, the pattern after writing can be formed with high accuracy.

Figure 4:
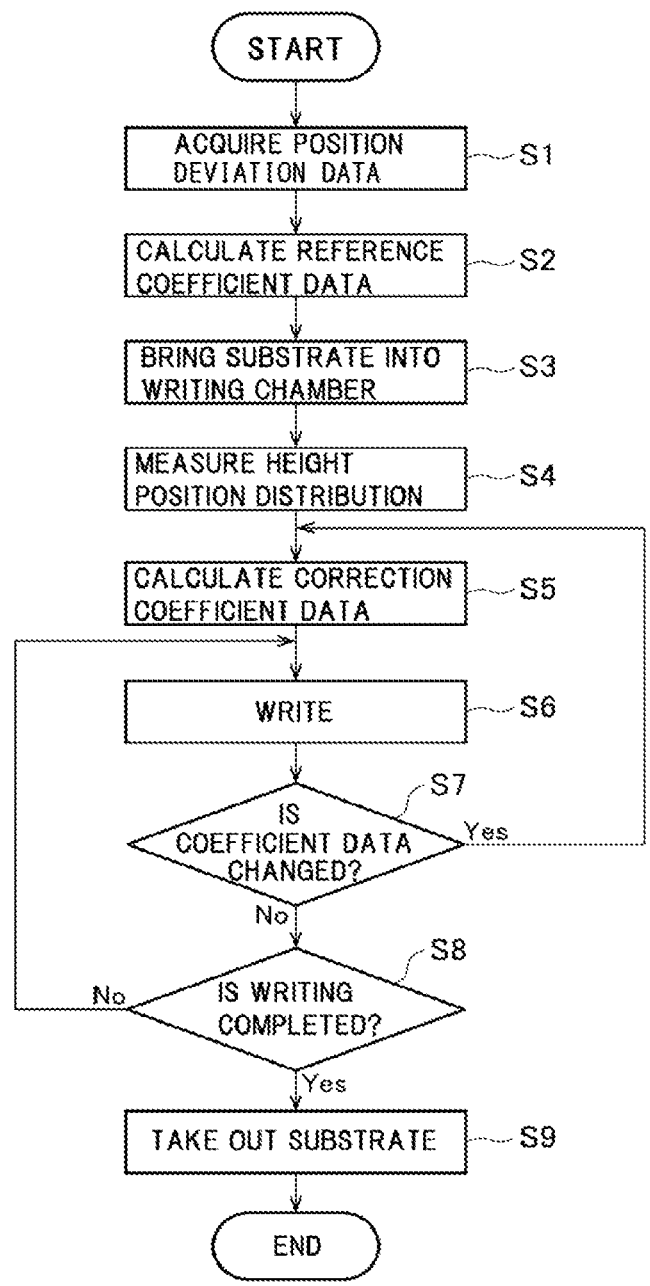
FIG. 4 is a flow chart for describing a writing method according to the present embodiment.

Next, a writing method according to the present embodiment will be described in accordance with a flow chart illustrated in FIG. 4.

First, the beam position measurer 111 acquires position deviation data indicating a beam position deviation distribution in a beam array plane of the multi-beam (step S1). For example, some beams among the multi-beam are grouped, the mark 106 provided on the XY stage 105 is scanned using the grouped beam array, and electrons reflected by the mark 106 are detected by the detector 211. The detection circuit 132 transmits the number of electrons detected by the detector 211 to the control calculator 110. The beam position measurer 111 generates a scan waveform from the number of electrons detected on a deflection amount basis, and calculates the position of the grouped beam array by using the position of the XY stage 105 as a reference. The position of the XY stage 105 is detected by the stage position detector 139.

Beams in another region of the multi-beam are grouped, and the position of the grouped beam array is calculated using substantially the same method. For each lattice point in the beam array, a beam position can be obtained by repeatedly performing this calculation. The difference between the calculated beam position and an ideal position is an average of the multi-beam position deviation amount at the lattice point. The beam position deviation distribution in the multi-beam array plane is calculated from the beam position deviation amount for each lattice point in the beam array, and is stored as position deviation data (the position deviation amount map) in the memory 142.

In addition, the amount of excitation of a lens (not illustrated) for dynamic adjustment (Z position correction) is changed, the above-described measurement is performed, position deviation data in a case where the focal position is changed is acquired, and the position deviation data is stored in the memory 142. For example, three pieces of position deviation data in a case where a focal position z is −2 μm, 0 μm, and 2 μm are acquired and stored in the memory 142. Specifically, for example, marks whose top surfaces are positioned at positions corresponding to −2 μm, 0 μm, and 2 μm serving as the focal position z are each used, multi-beam position measurement is performed in a state in which focus is achieved on the top surface of each mark, and the position deviation data indicating the beam position deviation distribution in the beam array plane of the multi-beam is acquired in respective cases where the focal position z is −2 μm, 0 μm, and 2 μm and is stored in the memory 142.

Next, in order to correct the dose distribution to be given to the sample based on the position deviation data, the coefficient calculator 112 calculates correction coefficients (reference coefficients) used to calculate a correction irradiation amount with which an irradiation amount for each pixel, that is, an irradiation amount of each beam of each shot of the multi-beam is corrected (step S2). A known method can be used to obtain the correction coefficients from the position deviation amounts. The calculated reference coefficient data is stored in the memory 144.

Figure 5:
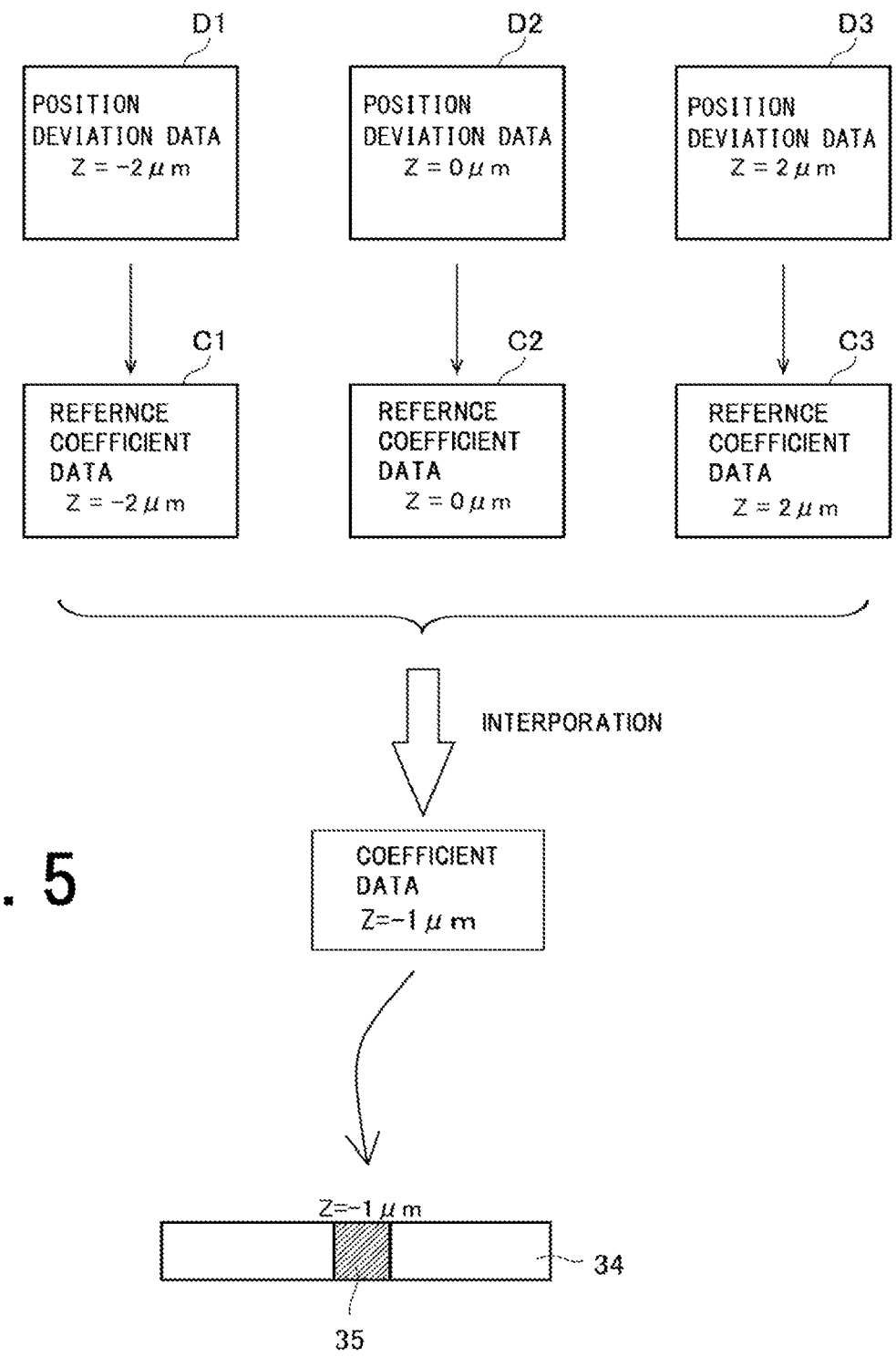
FIG. 5 is a diagram for describing an example of reference coefficient data interpolation.

Reference coefficient data is generated for each piece of the position deviation data using the position deviation data. For example, in the case of the above-described example, as illustrated in FIG. 5, reference coefficient data C1, C2, and C3 are generated from position deviation data D1 at the focal position z=−2 μm, position deviation data D2 at z=0 μm, and position deviation data D3 at z=2 μm, respectively. Here, the position deviation data describe a position deviation of each of multi beam or a distribution of position deviation of multi beam which varies depending on the position in the area of multiple beam array.

The substrate 101, which is a writing target, is brought into the writing chamber 103 and is placed on the XY stage 105 (step S3).

A height position distribution of the top surface (writing surface) of the substrate 101 is measured (step S4). For example, for each stripe region 34, while the XY stage 105 is being moved, an optical axis position on the surface of the substrate is irradiated with a laser from the phototransmitter 212, and reflected light is received by the photodetector 214. An output from the photodetector 214 is amplified by the amplifier 138 and is converted into digital data, and the digital data is output to the control calculator 110. The height measurer 113 acquires a height position distribution (Z map) of the substrate 101 based on outputs from the amplifier 138, and stores the height position distribution in the memory 146.

The coefficient calculator 112 calculates correction coefficient data in accordance with the height of the surface of the substrate in a region irradiated with a beam (step S5). The height of the region irradiated with the beam is obtained from the height position distribution stored in the memory 146. The coefficient calculator 112 calculates the correction coefficient data by interpolation using the reference coefficient data in accordance with the height of the beam irradiation region (position).

In the step of writing (step S6), first, the area density calculator 114 reads out writing data from the memory 140, and calculates a pattern area density ρ of all the pixels in each stripe region 34 using a pattern defined in the writing data. Pixels are obtained by virtually dividing the stripe region 34 in a mesh-like manner, and each of the pixels is, for example, of the same order of size as one beam. The irradiation amount calculator 115 calculates an irradiation amount $\rho D_0$ of a beam, with which each pixel is irradiated, by multiplying the pattern area density ρ by a reference irradiation amount $D_0$.

In addition, the irradiation amount calculator 115 calculates, based on the correction coefficient data, a correction irradiation amount D by subtracting an irradiation amount distributed to surrounding pixels from and adding an irradiation amount distributed from the surrounding pixel to the irradiation amount $\rho D_0$ of each pixel.

The data processor 116 converts the correction irradiation amount D into an irradiation time, and sorts irradiation times in order of shots in the writing sequence. The irradiation time array data obtained by performing sorting is output to the deflection control circuit 130.

The deflection control circuit 130 outputs the irradiation time array data to a control circuit of each blanker in the blanking plate 204. The writing controller 117 controls the writing unit 150, and causes the above-described writing processing to be executed.

In a case where the height of the beam irradiation region of the substrate 101 changes by a predetermined value or more, it is determined that the correction coefficient data needs to be changed (step S7_Yes), and the correction coefficient data is recalculated and updated.

The interval at which the correction coefficient data is recalculated and updated is set so that a change in the beam position deviation amount does not affect the writing accuracy. For example, in a case where the rate of change of the height of the substrate surface is low, the correction coefficient data is recalculated in units of a plurality of stripe regions 34. In a case where the rate of change of the height of the substrate surface is high, the correction coefficient data is recalculated for each of a plurality of regions obtained by dividing one stripe region 34 (note that the region is larger than the beam array size of the multi-beam).

When writing in all the stripe regions is completed (step S8_Yes), the substrate 101 is taken out (step S9).

In this manner, according to the present embodiment, a small number of pieces of reference coefficient data are calculated in advance from a small number of pieces of position deviation data, and correction coefficient data in accordance with a parameter value of an irradiation region (the height of the top surface of the substrate) is obtained by performing interpolation processing on the reference coefficient data. Thus, even in a case where the position deviation map changes due to dependency on the parameter during the writing processing, a pattern can be written with high accuracy.

As a different method from the above-described embodiment, a method is conceivable in which many pieces of position deviation data with small steps therebetween are obtained by performing interpolation processing on the position deviation data D1 to D3, which are obtained through measurement, and many pieces of coefficient data are generated in advance from the many pieces of position deviation data. However, in this method, generation of coefficient data involving high computational complexity needs to be performed many times, and thus a waiting time until the writing processing is started becomes long and the writing throughput decreases.

In contrast, in the present embodiment, calculation of at least two pieces of reference coefficient data is enough, and thus the computational complexity can be significantly reduced and the writing processing can be promptly started.

In the above-described embodiment, the example has been described in which, while focusing on one kind of parameter (focal position (the height of the substrate surface)), the reference coefficient data is calculated from the position deviation data, and the correction coefficient data is obtained by interpolation using a plurality of pieces of reference coefficient data; however, there may be two or more kinds of parameter.

For example, the position deviation data having two kinds of parameter, a focal position and pattern density, is generated. An evaluation pattern is written on an evaluation substrate by changing the focal point and the pattern density, and the position deviation data is obtained by measuring the position deviation amounts of the evaluation pattern at respective positions on the evaluation substrate.

Figure 6:
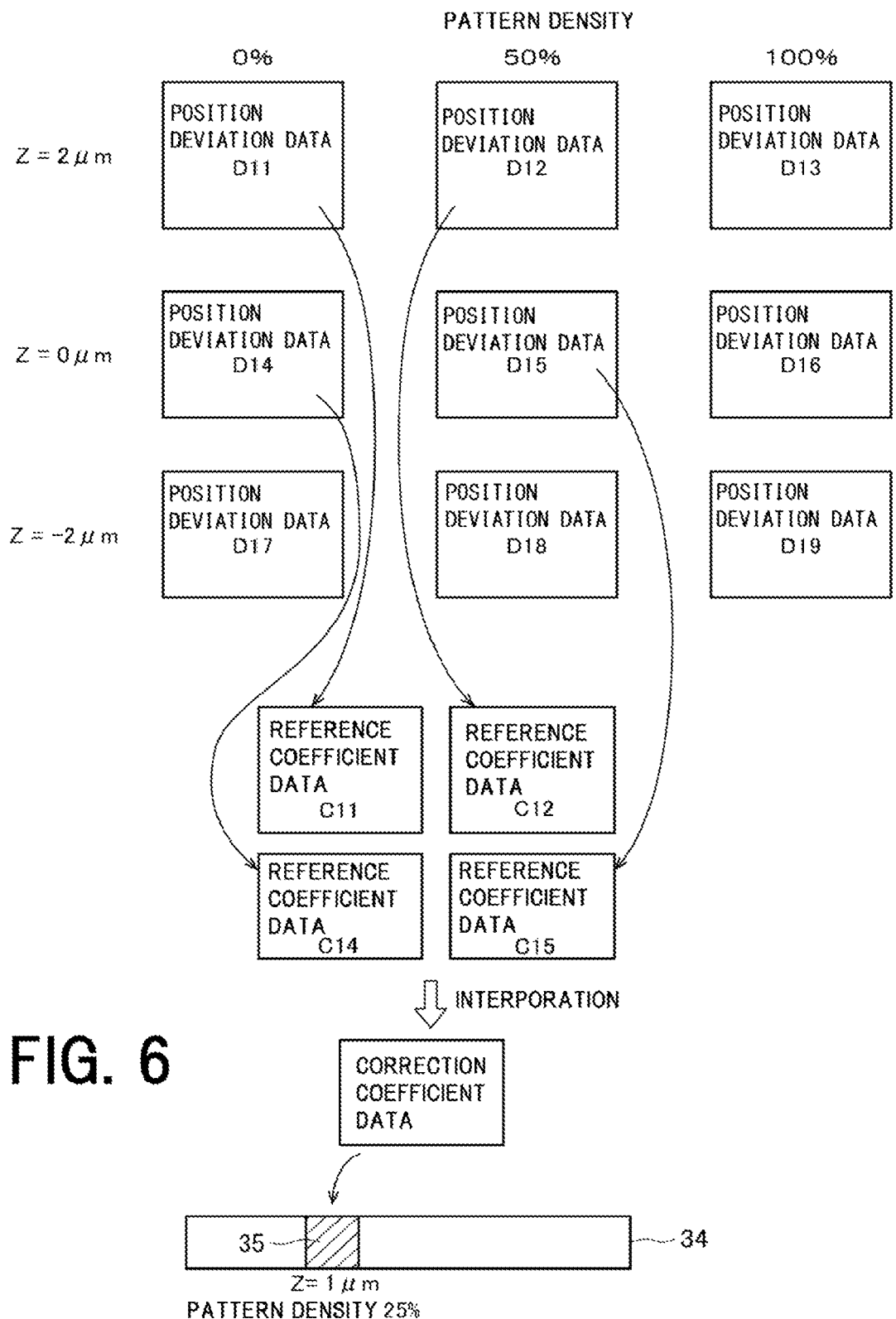
FIG. 6 is a diagram for describing an example of reference coefficient data interpolation.

For example, as illustrated in FIG. 6, nine pieces of position deviation data D11 to D19 are generated by setting the focal position z to 2 µm, 0 µm, and –2 µm and the pattern density to 0%, 50%, and 100%. Reference coefficient data C11 to C19 are calculated from the position deviation data D11 to D19. Note that illustration of the reference coefficient data C13 and C16 to C19 is omitted.

For example, in a case where the height of the surface of the beam irradiation region is 1 µm and the pattern density is 25%, the correction coefficient data is calculated by bilinear interpolation using the reference coefficient data C11, C12, C14, and C15.

There may be a case where a deviation amount distribution at an irradiation position of multi-beam changes over time due to various factors. In such a case, a position deviation amount distribution is measured at predetermined time intervals during writing, a position deviation distribution at the current time is calculated from previous position deviation distributions obtained before the current time during writing and is used in irradiation amount correction calculation. That is, reference coefficient data is calculated from the position deviation data at a time T1 and the position deviation data at a time T2 before the current time. In order to measure a position deviation amount distribution at predetermined time intervals during writing, for example, after completion of writing in a certain stripe region 34, writing is paused and a position deviation amount distribution is measured, and thereafter writing is restarted to perform writing in the subsequent stripe region 34.

Next, after the time T2, the position deviation data at a time T3, which is after the time T2, is calculated by extrapolation using the position deviation data at the time T1 and the time T2. Reference coefficient data is then calculated from the calculated position deviation data.

Figure 7:
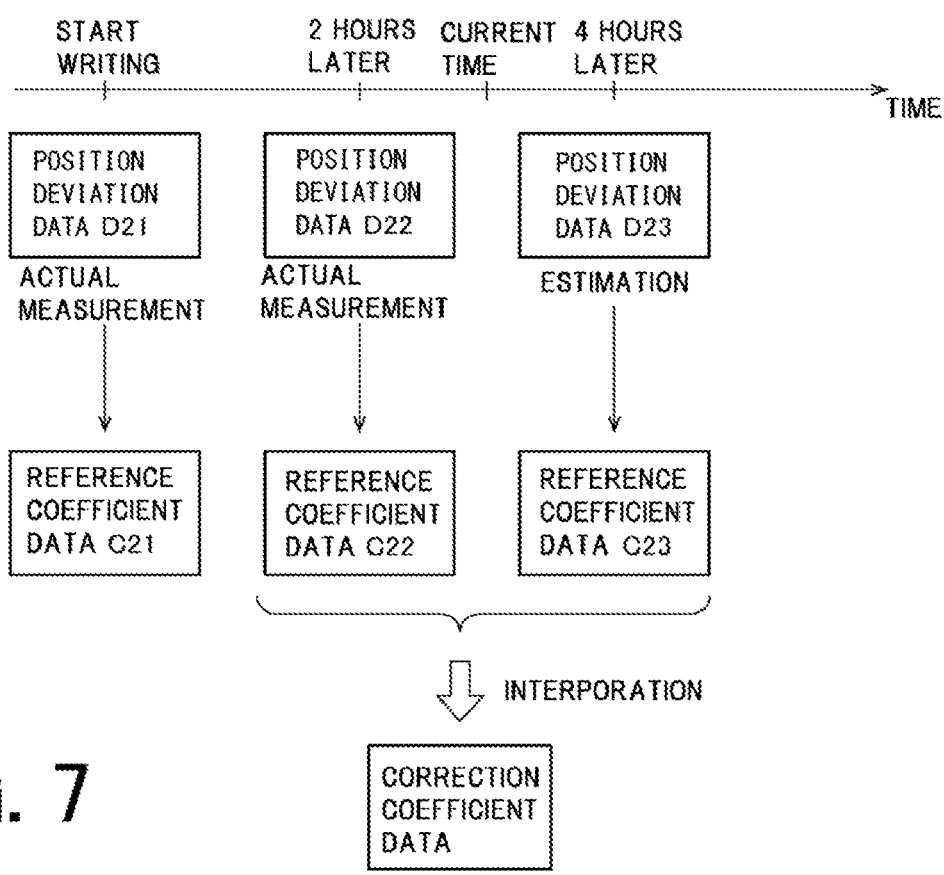
FIG. 7 is a diagram for describing an example of reference coefficient data interpolation.

For example, as illustrated in FIG. 7, position deviation data D21 at the writing start time and position deviation data D22 two hours after the start of writing are obtained from writing results of an evaluation pattern. Reference coefficient data C21 and C22 are then calculated from the position deviation data D21 and D22.

For example, in a case where the current time is three hours after the start of the writing, correction coefficient data is obtained as follows. Position deviation data D23 after four hours is estimated by extrapolation using the position deviation data D21 and D22. Reference coefficient data C23 is calculated from the position deviation data D23. The correction coefficient data for the current time, which is three hours after the start of writing, is then calculated by interpolation using the reference coefficient data C22 and C23. Alternatively, the correction coefficient data for the current time may be calculated by extrapolation using the reference coefficient data C21 and C22.

In this manner, by calculating correction coefficient data by interpolation using the reference coefficient data, while suppressing the amount of coefficient data (reference coefficient data) prepared in advance, irradiation amount modulation can be performed in accordance with a change in the position deviation map and a pattern can be written with high accuracy.

While certain embodiments have been described, these embodiments have been presented by way of example only, and are not intended to limit the scope of the inventions. For example, although the above embodiments employ the variable formation beam that is shaped at each shot and is irradiated, a beam having a definite shape may be irradiated. A plurality of beams can be irradiated simultaneously. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multi-beam writing method comprising:
   acquiring a plurality of pieces of position deviation data corresponding to a plurality of parameter values of a parameter that change position deviation amount of each beam of multi-beam irradiated on a substrate;
   calculating a plurality of pieces of reference coefficient data corresponding to each of the plurality of pieces of position deviation data;
   calculating coefficient data corresponding to a parameter value at an irradiation position of the multi-beam on the substrate using the plurality of pieces of reference coefficient data corresponding to the plurality of parameter values;
   modulating an irradiation amount of each beam of the multi-beam for each shot using the coefficient data; and
   writing a pattern by irradiating the substrate with each beam of at least a part of the multi-beam having the modulated irradiation amounts.

2. The method according to claim 1, wherein in a case where there are a plurality of parameters that change deviation in irradiation position of each beam of the multi-beam, for each of the plurality of parameters, the plurality of pieces of position deviation data corresponding to sets of the plurality of parameter values of the plurality of parameters are acquired, and the plurality of pieces of reference coefficient data are calculated for each set of the plurality of parameter values of the plurality of parameters, and
   the coefficient data corresponding to the set of the parameter values of the plurality of parameter at an irradiation position are calculated by interpolation or extrapolation using the plurality of pieces of reference coefficient data calculated for each set of the plurality of parameter values of the plurality of parameters.

3. The method according to claim 2, wherein the plurality of parameters include a focal position of the multi-beam and a pattern density.

4. The method according to claim 1, further comprising:
measuring beam position deviation of the multi-beam at least at discrete times during writing performed on the substrate, and acquiring the plurality of pieces of position deviation data indicating position deviation of each beam among the multi-beam from the measurement, wherein
using first position deviation data at a point in time after elapsing of a first time that is shorter than an elapsed time since starting writing and second position deviation data at a point in time after elapsing of a second time that is shorter than the elapsed time since starting the writing and longer than the first time, the first position deviation data and the second position deviation data are included in the plurality of pieces of position deviation data, and first reference coefficient data corresponding to the first position deviation data and second reference coefficient data corresponding to the second position deviation data are calculated, and
coefficient data corresponding to a current time is calculated by extrapolation using the first reference coefficient data and the second reference coefficient data.

5. The method according to claim 1, further comprising:
measuring the position deviation amount of each beam of the multi-beam at least at discrete times during writing performed on the substrate, and acquiring the plurality of pieces of position deviation data, wherein
using first position deviation data at a point in time after elapsing of a first time that is shorter than an elapsed time since starting writing and second position deviation data at a point in time after elapsing of a second time that is shorter than the elapsed time since starting the writing and longer than the first time, the first position deviation data and the second position deviation data are included in the plurality of pieces of position deviation data, and first reference coefficient data corresponding to the first position deviation data and second reference coefficient data corresponding to the second position deviation data are calculated,
regarding a third time that is longer than an elapsed time since starting the writing to a current time, third position deviation data at a point in time after elapsing of the third time is calculated using the first position deviation data and the second position deviation data, third reference coefficient data corresponding to the third position deviation data is calculated, and
coefficient data corresponding to a current time is calculated by interpolation using the second reference coefficient data and the third reference coefficient data.

6. A multi-beam writing apparatus comprising:
a memory storing a plurality of pieces of position deviation data corresponding to a plurality of parameter values of a parameter that change position deviation amount of each beam of multi-beam;
a coefficient calculator calculating, for each of the plurality of parameter values of the parameter, a plurality of pieces of reference coefficient data to be used in irradiation amount correction calculation in which an irradiation amount of each beam for each shot is modulated in order to correct an exposure amount distribution to be given by the multi-beam to a substrate, and calculating coefficient data corresponding to a parameter value of a parameter at an irradiation position of the multi-beam using the plurality of pieces of reference coefficient data;
an irradiation amount calculator modulating the irradiation amount of each beam for each shot using the coefficient data; and
a writer writing a pattern by irradiating the substrate with each beam having the modulated irradiation amounts.

7. The apparatus according to claim 6, wherein in a case where there are a plurality of parameter that change deviation in an irradiation position of each beam of the multi-beam, for each of the plurality of parameter, the memory stores the plurality of pieces of position deviation data corresponding to sets of the plurality of parameter values of the plurality of parameters, and
the coefficient calculator calculates the plurality of pieces of reference coefficient data for each set of the plurality of parameter values of the plurality of parameters, and calculates the coefficient data corresponding to the set of the parameter values of the plurality of parameter at an irradiation position by interpolation or extrapolation using the plurality of pieces of reference coefficient data calculated for each set of the plurality of the parameter values of the plurality of the parameter.

8. The apparatus according to claim 7, wherein the plurality of parameters include a focal position of the multi-beam and a pattern density.

9. The apparatus according to claim 6, wherein
a beam position deviation of the multi-beam is measured at least at discrete times during writing performed on the substrate,
the memory stores the position deviation data indicating position deviation of each beam of the multi-beam acquired from the measurement,
the plurality of pieces of position deviation data includes first position deviation data at a point in time after elapsing of a first time that is shorter than an elapsed time since starting writing and second position deviation data at a point in time after elapsing of a second time that is shorter than the elapsed time since starting the writing and longer than the first time, and
the coefficient calculator calculates, using the first position deviation data and the second position deviation data, first reference coefficient data corresponding to the first position deviation data and second reference coefficient data corresponding to the second position deviation data, and calculates coefficient data corresponding to a current time by extrapolation using the first reference coefficient data and the second reference coefficient data.

10. The apparatus according to claim 6, wherein
the beam position deviation amount of each beam of the multi-beam is measured at least at discrete times during writing performed on the substrate,
the memory stores the plurality of pieces of position deviation data indicating position deviation of each beam of the multi-beam acquired from the measurement,
the plurality of pieces of position deviation data includes first position deviation data at a point in time after elapsing of a first time that is shorter than an elapsed time since starting writing and second position deviation data at a point in time after elapsing of a second time that is shorter than the elapsed time since starting the writing and longer than the first time, and the coefficient calculator
> calculates, using the first position deviation data and the second position deviation data, first reference coefficient data corresponding to the first position deviation data and second reference coefficient data corresponding to the second position deviation data,
>
> calculates, regarding a third time that is longer than an elapsed time since the start of the writing to a current time, third position deviation data at a point in time after elapsing of the third time using the first position deviation data and the second position deviation data,
>
> calculates third reference coefficient data corresponding to the third position deviation data, and
>
> calculates coefficient data corresponding to a current time by interpolation using the second reference coefficient data and the third reference coefficient data.

* * * * *